United States Patent [19]

Yazawa et al.

[11] Patent Number: 4,819,043
[45] Date of Patent: Apr. 4, 1989

[54] MOSFET WITH REDUCED SHORT CHANNEL EFFECT

[75] Inventors: Yoshiaki Yazawa, Hitachi; Yutaka Kobayashi, Tokyo; Akira Fukami; Takahiro Nagano, both of Hitachi, all of Japan

[73] Assignee: Hitachi, Ltd., Tokyo, Japan

[21] Appl. No.: 936,604

[22] Filed: Dec. 1, 1986

[30] Foreign Application Priority Data

Nov. 29, 1985 [JP] Japan ............... 60-267152

[51] Int. Cl.$^4$ .............. H01L 29/78; H01L 27/02
[52] U.S. Cl. .................. 357/23.3; 357/23.1; 357/23.7; 357/23.12; 357/41; 357/23.9
[58] Field of Search ........... 357/41, 23.1, 23.3, 357/23.7, 23.8, 23.12, 23.9, 91

[56] References Cited

U.S. PATENT DOCUMENTS

| | | | |
|---|---|---|---|
| 3,283,221 | 11/1966 | Heiman | 357/23.12 |
| 3,936,857 | 2/1976 | Ota | 357/23.3 |
| 4,000,504 | 12/1976 | Berger | 357/91 |
| 4,613,882 | 9/1986 | Pimbley et al. | 357/23.12 |
| 4,636,822 | 1/1987 | Codella et al. | 357/115 |

FOREIGN PATENT DOCUMENTS

| | | | |
|---|---|---|---|
| 0031177 | 2/1982 | Japan | 357/23.7 |
| 6050960 | 3/1985 | Japan | 357/23.12 |
| 2027992 | 2/1980 | United Kingdom | 357/23.8 |

OTHER PUBLICATIONS

IEDM 1978, "A Normally-Off... Circuits", by Nishiuchi et al., pp. 26-29.
T. Wada et al., "A Study of Hot. Carrier... Device Simulator", presented at the 45th Japanese Applied Physics Conference, Oct. 12-15, 1984.

*Primary Examiner*—Martin H. Edlow
*Assistant Examiner*—Donald J. Featherstone
*Attorney, Agent, or Firm*—Antonelli, Terry & Wands

[57] ABSTRACT

An MOSFET provided with a gate insulating film formed on a semiconductor surface between a source region and a drain region, a gate electrode formed on the gate insulating film, and a channel region sandwiched between the source region and the drain region and made up of a first layer and a second layer is disclosed in which the first layer lies beneath the gate insulating film and is opposite in conductivity type to the source and drain regions, the second layer lies beneath the first layer and has the same conductivity type as the source and drain regions, and the length of the second layer between the source region and the drain region is greater than the length of the first layer between the source region and the drain region.

7 Claims, 12 Drawing Sheets

MOSFET WITH REDUCED SHORT CHANNEL EFFECT

BACKGROUND OF THE INVENTION

The present invention relates to a semiconductor device, and more particularly to an MOSFET (namely, a metal-oxide-semiconductor field effect transistor) which is formed on a semiconductor substrate and is high in operation speed and reliability, and in which the gate length in the direction from the source to the drain can be reduced below 1 μm, e.g. into the submicron range.

Figure 1A:
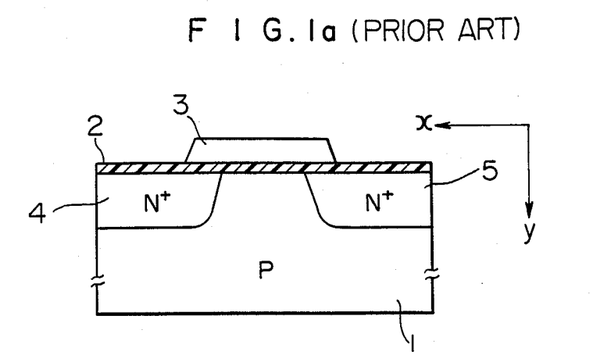
FIG. 1a is a sectional view showing a conventional MOSFET.
Figure 1B:
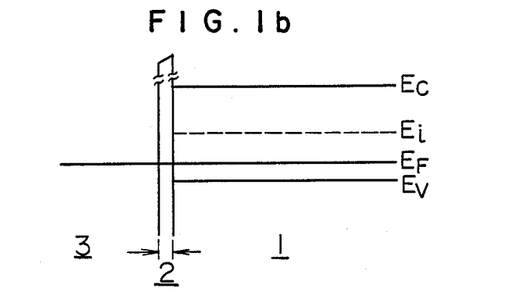
FIG. 1b is the energy band diagram of the MOSFET of FIG. 1a in the OFF-state thereof.
Figure 1C:
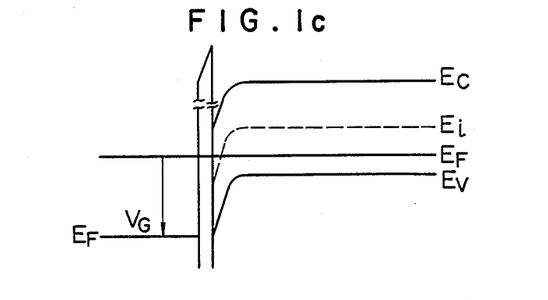
FIG. 1c is the energy band diagram of the MOSFET of FIG. 1a in the ON-state thereof.

FIG. 1a shows an ordinary N-channel MOSFET in which a channel is formed in the surface of a semiconductor substrate. Referring to FIG. 1a, a gate insulating film 2 is formed on a P-type semiconductor substrate 1, and a gate electrode 3 is formed on the gate insulating film 2. Further, an N+-source region 4 and an N+-drain region 5 are formed in the substrate 1. The operation mechanism of this MOSFET will be briefly explained. FIG. 1b is an energy band diagram in the channel portion of the MOSFET of FIG. 1a in an OFF-state thereof, and FIG. 1c is an energy band diagram in the channel portion of the above MOSFET in an ON-state. In FIGS. 1b and 1c, reference symbol $E_c$ designates the bottom of conduction band, $E_i$ a mid-gap level or the Fermi level for an intrinsic semiconductor, $E_F$ a Fermi level, $E_v$ the top of valence band, and $V_G$ a voltage applied to the gate electrode. The flat band voltage is assumed to be zero as seen from FIG. 1b. A channel, through which a drain current flows, is formed only in that surface portion of the semiconductor substrate 1 which lies beneath the gate insulating film 2. Accordingly, the drain current concentrates in a surface portion having a depth of tens of angstroms. As can be seen from FIG. 1c, a strong electric field in a y-direction (that is, a direction perpendicular to the drain current) is formed in the vicinity of the surface of the semiconductor substrate, and becomes maximum at the substrate surface. Near the surface, the electron mobility is reduced by the surface scattering effect. Thus, the conventional MOSFET of FIG. 1a encounters with the first problem that a reduction in electron mobility due to the strong electric field in the y-direction makes it impossible to obtain a large drain current.

Further, the above MOSFET encounters second problem that the characteristics of the MOSFET are deteriorated by hot carriers. When the length (in the source-drain direction) of the gate electrode is made small, the peak intensity of an electric field concentrating to that end portion of the drain region 5 which exists under the gate electrode 3, becomes large, and part of the high-energy carriers (namely, hot carriers) generated at the above end portion enter into the gate insulating film 2. Thus, the characteristics of the MOSFET are deteriorated.

In more detail, when the hot carriers enter into the gate insulating film 2, there arise various phenomena such as an increase in threshold voltage, the formation of trapping level in an interface between the semiconductor substrate and the gate insulating film, a reduction in carrier mobility, and an increase in subthreshold current. Thus, the characteristics of the MOSFET are deteriorated, and the reliability thereof is reduced. Accordingly, in order to make the gate length small, it is necessary to devise means for decreasing the peak intensity of electric field at the above end portion of the drain region.

Figure 2:
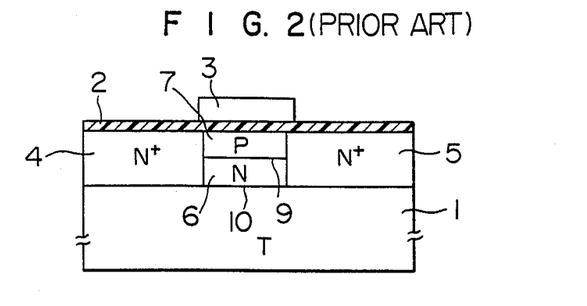
FIG. 2 is a sectional view showing another conventional MOSFET.

As one of means for solving the above problems, a structure shown in FIG. 2 has been proposed in Japanese Kokai Patent Publication No. 60-50960 (1985).

SUMMARY OF THE INVENTION

Now, the structure and operation mechanism of an N-channel MOSFET disclosed in the above publication will be briefly explained, by way of example.

Figure 3A:
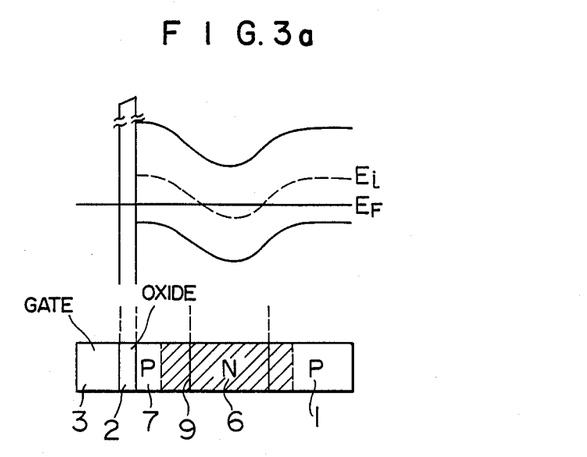
FIG. 3a shows the energy band structure and the spread of depletion layer in the OFF-state of the MOSFET of FIG. 2.
Figure 3B:
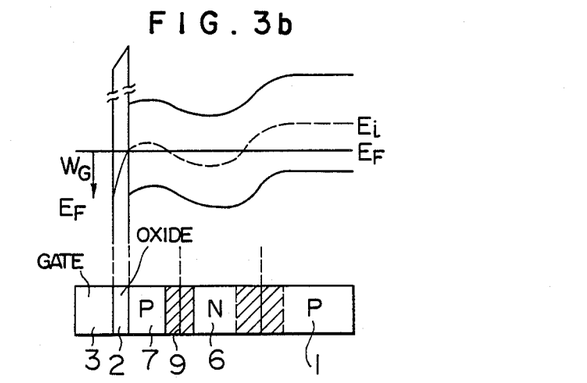
FIG. 3b shows the energy band structure and the spread of depletion layer in the ON-state of the MOSFET of FIG. 2.

Referring to FIG. 2, a P-type layer 7 opposite in conductivity type to the source and drain regions 4 and 5, is formed in a surface portion of a channel formation region which lies beneath the gate insulating film 2, and an N-type layer 6 of the same conductivity type but smaller in impurity concentration than the source and drain regions is formed in the remaining portion of the channel formation region, that is, beneath the P-type layer 7. The bottom of the N-type layer 6 is kept in contact with the P-type semiconductor substrate 1. FIGS. 3a and 3b are diagrams for explaining the operation of the MOSFET of FIG. 2. That is, FIG. 3a shows the energy band structure and the spread of the depletion layer (that is, hatched area) in the OFF-state of the MOSFET, and FIG. 3b shows the energy band structure and the spread of the depletion layer in the ON-state of the MOSFET. In the ON-state, as shown in FIG. 3b, each of the depletion layers is contracted, and a channel through which a current can flow, is formed in the N-type layer 6. As a result, the injection of hot carriers into a gate region is decreased, and the carrier mobility is increased. However, the above structure encounters with a problem that when the gate length is made less than 1.3 μm, an MOSFET having the above structure cannot show normal operation characteristics. This problem will be explained below in more detail.

A failure in normal operation caused by making the gate length small is called "short channel effect". In order to make it possible to shorten the gate length without producing the short channel effect, it is necessary to know the current control mechanism of the MOSFET.

Figure 4:
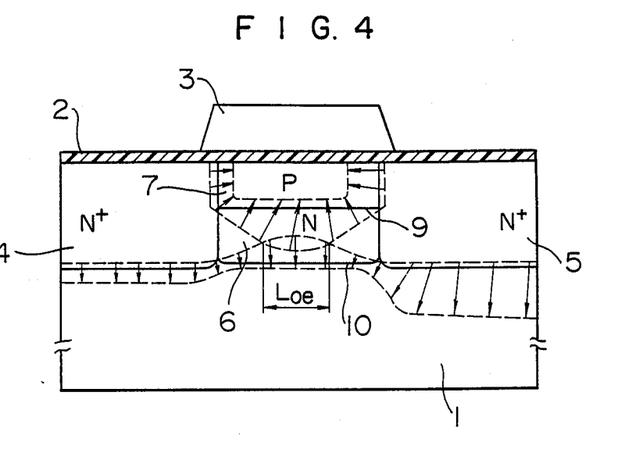
FIG. 4 shows the distribution of lines of electric force in depletion layers of the MOSFET of FIG. 2 at a time the MOSFET is put in the OFF-state.

First, explanation will be made of the current interrupting mechanism in the MOSFET of FIG. 2. FIG. 4 shows depletion layers in the OFF-state of the MOSFET of FIG. 2 and lines of electric force in the depletion layers. It is to be noted that the OFF-state of FIG. 4 is obtained when a drain-source voltage and a gate-source voltage are made equal to 5 V and 0 V, respectively. Further, in FIG. 4, a region bounded by a pair of broken lines indicates a depletion layer, and arrows indicate lines of electric force. As shown in FIG. 4, a depletion layer due to a PN junction 9 is extended into the N-type layer 6, and another depletion layer due to another PN junction 10 between the P-type semiconductor substrate 1 and the N-type layer 6 is also extended into the N-type layer 6. These depletion layers overlap each other in the N-type layer 6, and thus a current path in the N-type layer 6 is blocked.

The depletion layers due to the PN junctions 9 and 10 are difficult to extend toward the N-type layer 6, in the vicinity of the boundary between the N-type layer 6 and each of the source and drain regions 4 and 5. This is because electrons flow from the source and drain regions 4 and 5 which are higher in impurity concentration than the N-type layer 6, into the N-type layer 6 so that a thermal equilibrium state is established, and thus portions of the N-type layer 6 existing near the source and drain regions become higher in electron density than a central portion of the N-type layer 6. The absence of a depletion layer in the neighborhood of the boundary between the N-type layer 6 and each of the source and drain regions 4 and 5 makes the length of the current blocking region formed in the N-type layer 6 smaller than the length of the N-type layer 6. Accordingly, in an MOSFET which has the OFF-state shown in FIG. 4, the effective channel length $L_{oe}$ is shorter than the actual length of the gate electrode 3. As a result, when the gate length of an MOSFET having the structure of FIG. 2 is made small, the short channel effect will become remarkable. That is, there arise problems such as a reduction in controllability of gate threshold voltage, a reduction in the breakdown voltage between the source region and the drain region, and the deterioration of sub-threshold characteristics.

Figure 5:
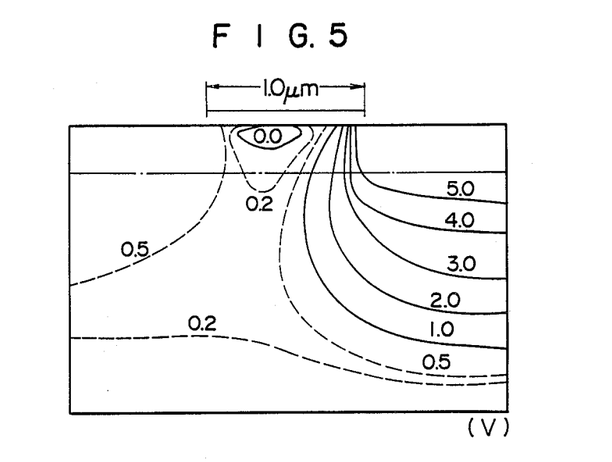
FIG. 5 is a diagram showing the potential distribution in the MOSFET of FIG. 2 kept at the OFF-state which distribution is obtained by simulation.

FIG. 5 shows the potential distribution in the MOSFET having the structure of FIG. 2 which distribution is obtained by simulation. In FIG. 5, a range indicated by arrows is a region where the gate electrode 3 is provided, and the gate length is equal to 1.0 μm. Further, the potential distribution of FIG. 5 is formed when the same drain-source voltage and gate-source voltage as in the OFF-state of FIG. 4 are used. Now, let us pay attention to an upper one of equipotential curves of 0.2 V, by way of example. The length of an area bounded by the above equipotential curve in a direction from the source region toward the drain region becomes small at the bottom (indicated by a dotted broken line) of the N-type layer 6. This is because the potential distribution in the layer 6 is greatly affected not only by a gate voltage but also a drain voltage. In other words, the above fact indicates that the controllabilty of the drain current by the gate voltage is decreased.

As mentioned above, the structure of FIG. 2 has some drawbacks. Further, when the above structure is actually fabricated, the short channel effect will become more serious.

Figure 6A:
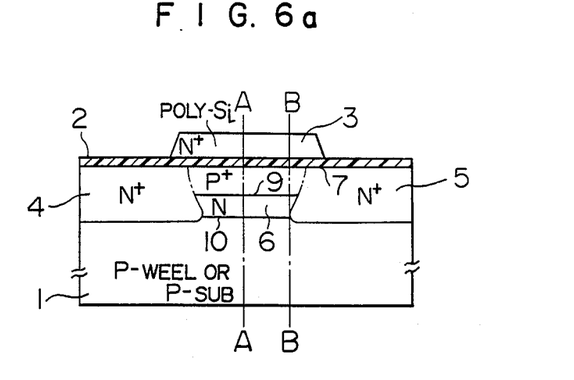
FIG. 6a is a sectional view showing an MOSFET which is actually fabricated so as to have the structure shown in FIG. 2.
Figure 6B:
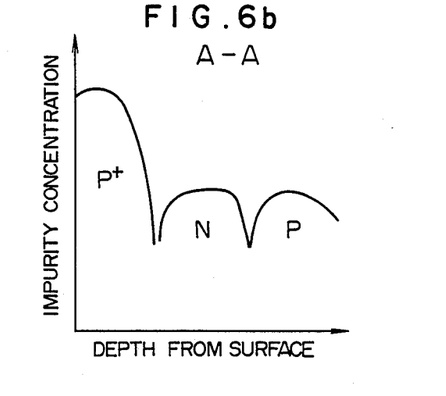
Figure 6C:
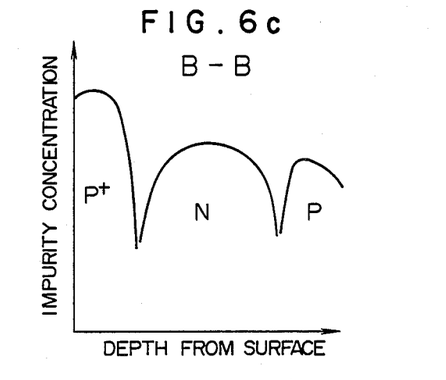
Figure 6D:
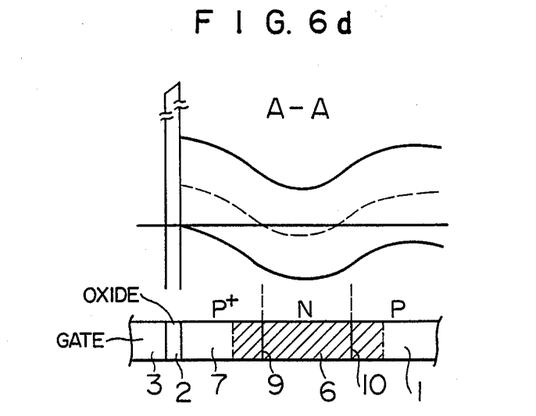
FIGS. 6d and 6e show the energy band structure and the spread of depletion layer at the cross section taken along the line A—A, and those at the cross section taken along the line B—B, respectively.
Figure 6E:
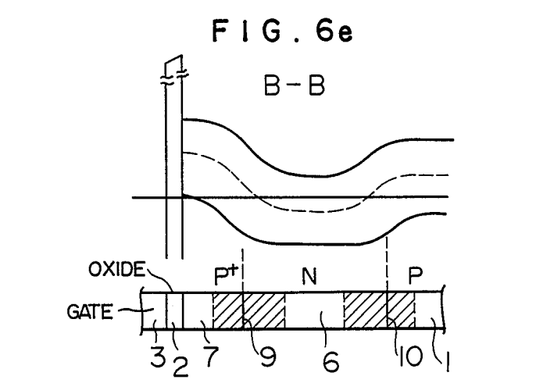

FIGS. 6a to 6e show the actual structure of the MOSFET of FIG. 2, and the impurity concentration profile, the energy band structure and the spread of depletion layer in the MOSFET, in a case where the MOSFET is made by a well-known fabrication process. As shown in FIGS. 6a to 6c, a donor impurity is allowed to diffuse from the highly-doped source and drain regions 4 and 5 into the N-type layer 6 in lateral directions. While the PN junction 9 at the side surface of the P-type layer 7 is scarcely affected by such impurity diffusion because of the high impurity concentration in the P-type region 7, the impurity concentration of the lightly-doped N-type layer 6 is greatly influenced (increased) in the vicinity of the source and drain regions 4 and 5. Accordingly, in the OFF-state of the above MOSFET, the extension of depletion layer at end portions of the N-type layer 6 is suppressed to be far less than that at a central portion of the N-type layer 6, as shown in FIG. 6d and 6e. That is, it is very difficult to further reduce the gate length of an MOSFET having the structure of FIG. 2 without deteriorating the characteristics. Thus, the appearance of an MOSFET which is large in carrier mobility, is scarcely degraded by hot carrier, and moreover is small in gate length, has been strongly desired.

It is an object of the present invention to provide a semiconductor device in which a reduction in carrier mobility caused by surface scattering is made as small as possible, a strong current driving force is obtained, a current path is formed in a deep portion of a semiconductor substrate to prevent a reduction in reliability due to hot carrier, and the gate length can be made small without producing any adverse effect.

In order to attain the above object, according to the present invention, there is provided a semiconductor device having a channel formation region formed beneath a gate insulating film and between a source and a drain region, and made up of first and second semiconductor layers opposite in conductivity type to each other, in which the first semiconductor layer lies beneath the gate insulating film and is opposite in conductivity type to the source and drain regions, the second semiconductor layer lies beneath the first semiconductor layer and has the same conductivity type as the source and drain regions, and the length of the second semiconductor layer between the source region and the drain region is greater than the length of the first semiconductor layer between the source region and the drain region, to avert the short channel effect.

BRIEF DESCRIPTION OF THE DRAWINGS

FIGS. 6b and 6c are graphs showing the impurity concentration distribution along the lines A—A and B—B of FIG. 6a.

DESCRIPTION OF THE PREFERRED EMBODIMENTS

Now, embodiments of the present invention will be explained below, by reference to the accompanying drawings.

Figure 7:
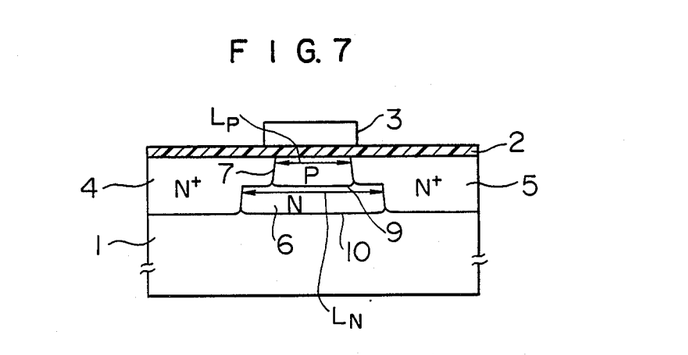
FIG. 7 is a sectional view showing an embodiment of an MOSFET according to the present invention.

FIG. 7 is a sectional view showing an embodiment of an MOSFET according to the present invention which embodiment has an N-channel. Referring to FIG. 7, a gate insulating film 2 is formed on a P-type semiconductor substrate 1, and a gate electrode 3 is formed on the gate insulating film 3. Further, an N+-source region 4 and an N+-drain region 5 are formed in a surface portion of the substrate 1. A P-type layer 7 opposite in conductivity type to the source and drain regions 4 and 5 is formed in a surface portion of a channel formation region lying beneath the gate insulating film 2, and an N-type layer 6 of the same conductivity type but smaller in impurity concentration than the source and drain regions, is formed beneath the P-type layer 7 so that the length $L_N$ of the N-type layer 6 is larger than the length $L_P$ of the P-type layer 7.

Figure 8:
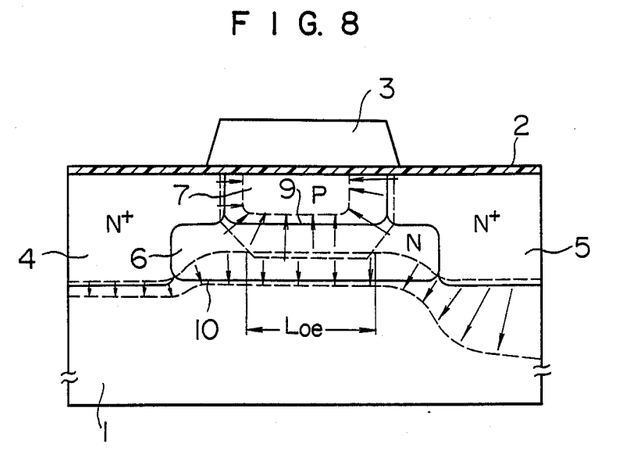
FIG. 8 is a diagram showing the distribution of lines of electric force in depletion layers of the embodiment of FIG. 7 at a time the embodiment is put in the OFF-state.

FIG. 8 shows the spread of depletion layers in the present embodiment and lines of electric force in each of depletion layers, at a time the present embodiment is put in an OFF-state. In FIG. 8, an area bounded by a pair of broken lines indicates a depletion layer and arrows indicate lines of electric force in depletion layers, as in FIG. 4. When FIG. 8 is compared with FIG. 4, the length of a current blocking region which is formed in the N-type layer 6 because of the extension of each depletion layer into the N-type layer 6, that is, the effective channel length $L_{oe}$ is larger in FIG. 8 than in FIG. 4. That is, according to the present invention, a current path in the N-type layer 6 can be readily blocked even when the gate length is made small. In other words, even when the gate electrode 3 is made small in size so that the effective channel length becomes short, a current flowing through the N-type layer 6 can be controlled by a gate voltage.

Figure 9:
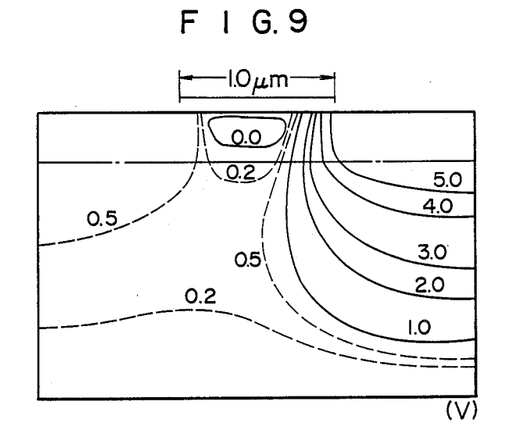
FIG. 9 is a diagram showing the potential distribution in the embodiment of FIG. 7 kept at the OFF-state which distribution is obtained by simulation.

FIG. 9 shows the potential distribution in the present embodiment kept at the OFF-state of FIG. 8 which distribution is obtained by simulation. Now, let us pay attention to an upper one of the equipotential curves of 0.2 V. The width of an area bounded by the above equipotential curve in a direction from the source region toward the drain region is only a little reduced even at the bottom of the N-type layer 6 indicated by a dot-dash line, as can be seen from the comparison of FIG. 9 with FIG. 5. This indicates that the present embodiment is superior in current controllability to the MOSFET of FIG. 2 even when their channel length is made small.

Figure 10:
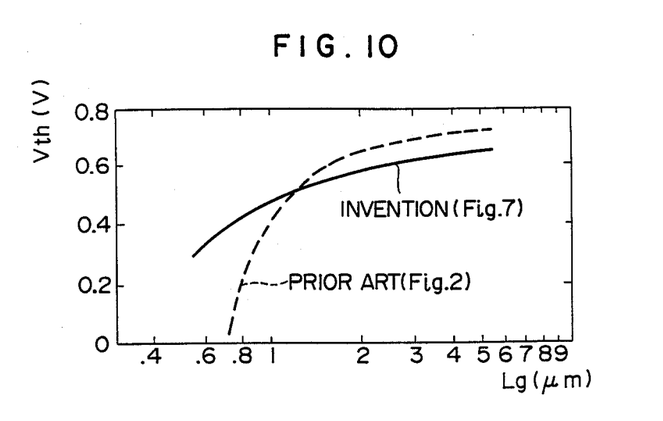
FIG. 10 is a graph showing a relation between gate length $L_g$ and threshold voltage $V_{th}$ in each of the embodiment of FIG. 7 and the MOSFET of FIG. 2.

FIG. 10 shows relations between the gate length $L_g$ and the threshold voltage $V_{th}$. In FIG. 10, a solid line indicates the above relation in the present embodiment, and a broken line indicates the relation in the conventional MOSFET of FIG. 2. As can be seen from FIG. 10, according to the conventional MOSFET, it becomes very difficult to control the threshold voltage $V_{th}$ when the gate length is made less than 1 μm. While, according to the present invention, even when the gate length is made less than 0.8 μm, a reduction in threshold voltage is only a small amount, and the threshold voltage can be accurately controlled.

Further, the difference between the gate length and the effective channel length $L_{oe}$ in the conventional MOSFET, that is, the above difference shown in FIG. 4, is larger than the difference between the gate length and the effective channel length $L_{oe}$ in the present embodiment, that is, the difference in FIG. 8. Accordingly, the current blocking region across which a drain-source voltage is applied, is longer in the present embodiment than in the conventional MOSFET. Thus, a maximum electric field intensity in the N-type layer 6 is smaller in the present embodiment than in the conventional MOSFET. That is, the present embodiment is higher in breakdown voltage between the source region 4 and the drain region 5 than the conventional MOSFET.

The above explanation holds for a case where a gate voltage is applied to the gate electrode so as to form a channel in the N-type layer 6. That is, according to the structure shown in FIG. 8, the electric field which is formed in a channel formation region kept at an ON-state, is weak, and thus the probability that hot carriers are generated is reduced. Moreover, a channel current flows through a deep portion of the channel formation region. Accordingly, a reduction in reliability due to the injection of hot carriers into a gate region scarcely occurs.

Further, let us consider the carrier mobility. When the intensity of an electric field for drifting carriers becomes greater than $10^3$ V/cm, the drift velocity of carrier begins to approach a saturation value. When the electric field is strengthened to an intensity of $10^4$ to $10^5$ V/cm, the drift velocity becomes nearly equal to the saturation value. In the ON-state of the conventional MOSFET of FIG. 2 having small channel length, the drift velocity of carrier reaches the saturation value, because of a strong electric field formed in the N-type layer 6. While, in the ON-state of the present embodiment of FIG. 7, the electric field in the N-type layer 6 is weak, and moreover the electric field in the channel is relatively uniform. Accordingly, the drift velocity of carrier does not reach the saturation value, unless a higher voltage than usual is applied between the source region and the drain region. That is, the current driving force in the present embodiment is large, in spite of the fact that the present embodiment is greater in effective channel length than the conventional MOSFET of FIG. 2. In other words, in the present embodiment, the same drain current as in the conventional MOSFET can be obtained by a gate voltage which is smaller than a gate voltage in the conventional MOSFET. Hence, the present embodiment is considered to be more reliable than the conventional MOSFET.

It can be understood from the above explanation that, according to the present invention, there is provided an MOSFET in which a large current driving force is obtained, a reduction in reliability due to the injection of hot carrier into the gate region is made as small as possible, and moreover the gate length can be made less than 1 μm.

Next, an example of the fabrication process of the present embodiment will be explained below, by reference to FIGS. 11a to 11f.

Figure 11A:
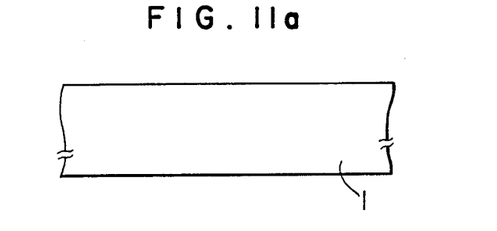
FIGS. 11a to 11f are sectional views showing the fabrication process of the embodiment of FIG. 7.
Figure 11B:
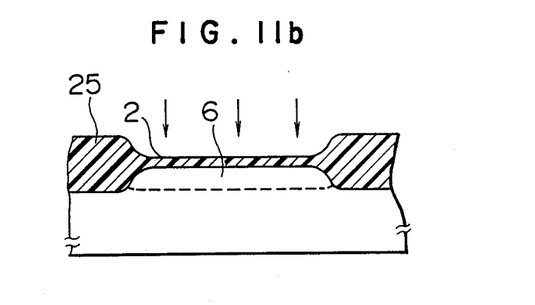
Figure 11C:
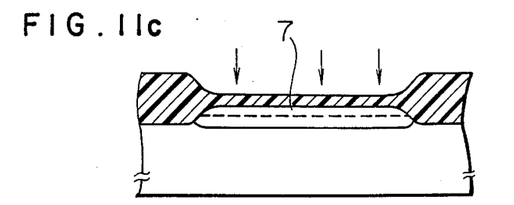
Figure 11D:
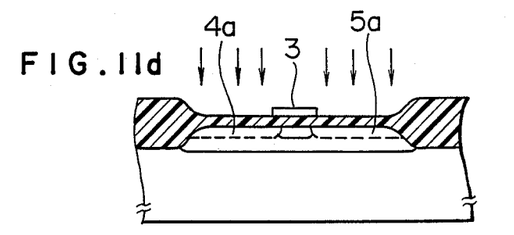
Figure 11E:
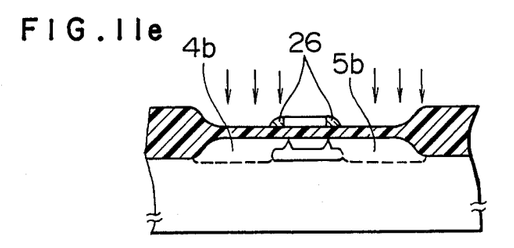
Figure 11F:
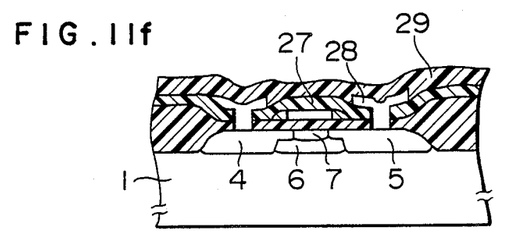

First, a P-type semiconductor substrate 1 having a sheet resistivity of 10 Ω/□ is prepared, as shown in FIG. 11a. Next, boron ions are implanted into the substrate 1 at an accelerating voltage of 150 kV and at a dose of $5 \times 10^{11}$ cm$^{-2}$. Then, as shown in FIG. 11b, a separating oxide film (the so-called LOCOS) 25 and a gate insulating film 2 having a thickness of 200 Å are formed, and phosphorus ions are implanted into the substrate 1 at an accelerating voltage of 150 kV and at a dose of $2 \times 10^{12}$ cm$^{-2}$, to form an N-type layer 6. Next, as shown in FIG. 11c, boron ions are implanted into N-type layer 6 at an accelerating voltage of 15 kV and a dose of $1 \times 10^{12}$ cm$^{-2}$, to form a P-type layer 7. Further, as shown in FIG. 11d, shallow N+-regions 4a and 5a for forming source and drain regions 4 and 5 are formed by the phosphorus ion implantation using an accelerating voltage of 50 kV and a dose rate of $5 \times 10^{12}$ cm$^{-2}$, and a gate electrode 3 is selectively formed. Then, as shown in FIG. 11e, side walls 26 at both ends of the gate electrode 3 are made of an insulating material, and deep N+-regions 4b and 5b serving as the source and drain regions 4 and 5 are formed by the arsenic ion implantation using an accelerating voltage of 80 kV and a dose rate of $5 \times 10^{15}$ cm$^{-2}$. Finally, as shown in FIG. 11f, an inter-layer insulating film 27, interconnection 28, and a passivation film 29 are formed. The above fabrication process uses well-known techniques for forming an integrated circuit, and does not include any special step. Although the present embodiment shown in FIG. 7 and fabricated by the process of FIGS. 11a to 11f is an N-channel MOSFET, the present invention is not limited to the N-channel MOSFET but is applicable to a P-channel MOSFET.

Figure 12:
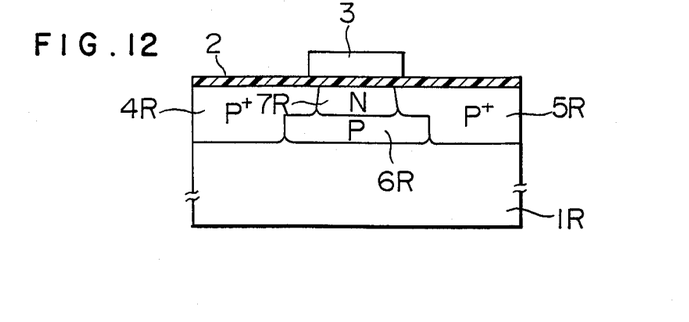
FIG. 12 is a sectional view showing another embodiment of an MOSFET according to the present invention which embodiment has a P-channel.

FIG. 12 shows another embodiment of an MOSFET according to the present invention, that is, a P-channel MOSFET according to the present invention. In FIG. 12, parts designated by reference numerals followed by a character R are opposite in conductivity type to parts which are designated by the same reference numerals in FIG. 7. In the present embodiment, a channel formation region formed under the gate electrode 3 includes an N-type layer 7R kept in contact with the gate insulating film 2 and a P-type layer 6R lying beneath the N-type layer 7R, and the length of the P-type layer 6R in the direction of channel is made greater than the length of the N-type layer 7R in the above direction. Thus, the short channel effect can be lessened even in the P-channel MOSFET.

Next, the fabrication process of a complementary MOS including the N-channel MOSFET of FIG. 7 and the P-channel MOSFET of FIG. 12 will be explained, by reference to FIGS. 13a to 13h.

Figure 13A:
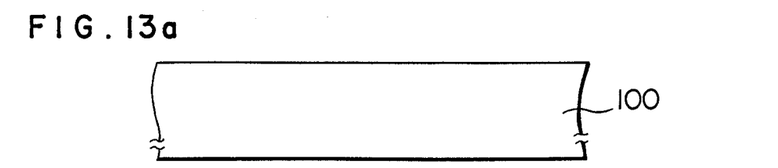
FIGS. 13a to 13h are sectional views showing the fabrication process of a complementary MOS according to the present invention.
Figure 13B:
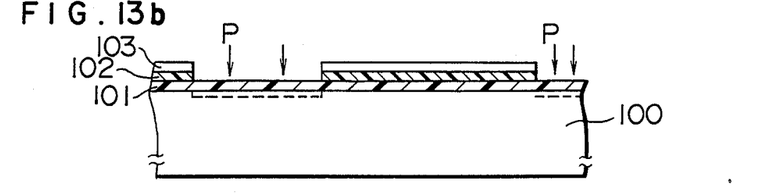
Figure 13C:
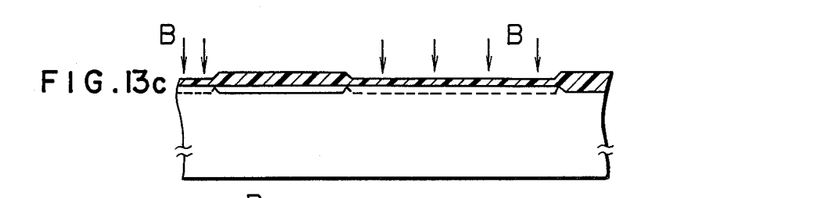
Figure 13D:
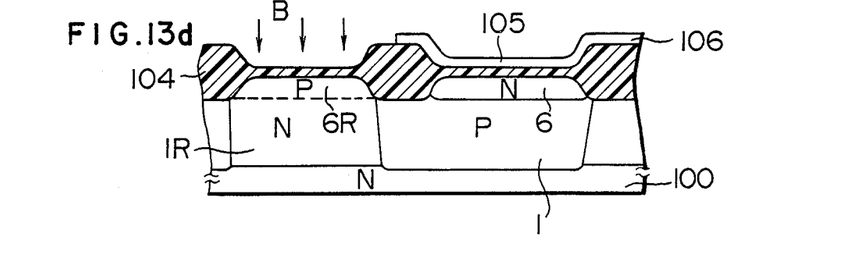
Figure 13E:
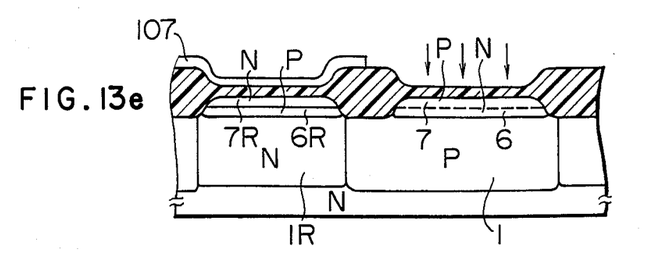
Figure 13F:
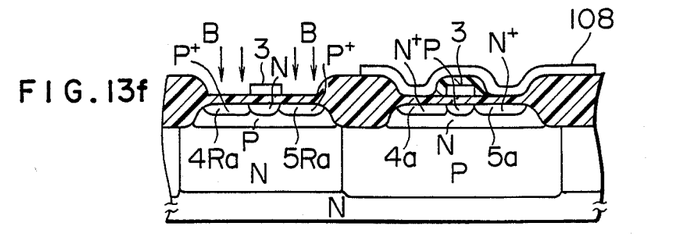
Figure 13G:
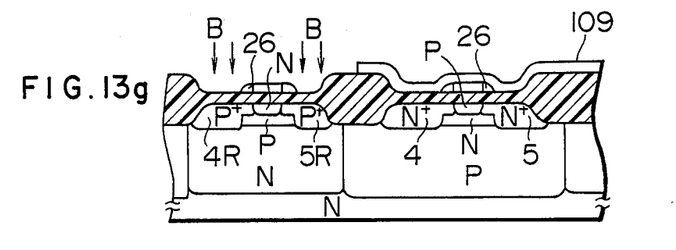

First, as shown in FIG. 13a, an N-type semiconductor substrate 100 having a sheet resistivity of 10 Ω/□ is prepared. Next, as shown in FIG. 13b, a silicon oxide film 101 is formed on the upper main surface of the substrate 100, and a silicon nitride film 102 is formed on the silicon oxide film 101. Then, the silicon nitride film 102 is selectively etched off by using a photoresist film 103, and phosphorus ions are implanted into the substrate at an accelerating voltage of 240 kV and a dose rate of $3 \times 10^{11}$ cm$^{-2}$ to form an N-type well 1R (corresponding to the N-type substrate 1R of FIG. 12). Next, as shown in FIG. 13c, boron ions are implanted into the substrate 100 at an accelerating voltage of 150 kV and a dose rate of $5 \times 10^{11}$ cm$^{-2}$, to form a P-type well 1 (corresponding to the P-type substrate 1 of FIG. 7). Thereafter, as shown in FIG. 13d, a separating oxide film (LOCOS) 104 is formed, and a silicon oxide film 105 having a thickness of 200 Å and serving gate insulating film is formed. Further, an N-type layer 6 corresponding to the layer 6 of FIG. 7 and a P-type layer 6R corresponding to the layer 6R of FIG. 12 are formed by the ion implantation using a resist film 106. That is, phosphorus ions are implanted in the substrate 100 at an accelerating voltage of 150 kV and a dose rate of $6 \times 10^{11}$ cm$^{-2}$ to form the N-type layer 6, and boron ions are implanted into the substrate at an accelerating voltage of 50 kV and a dose rate of $5 \times 10^{11}$ cm$^{-2}$ to form the P-type layer 6R. Then, as shown in FIG. 13e, an N-type layer 7R corresponding to the layer 7R of FIG. 12 and a P-type layer 7 corresponding to the layer 7 of FIG. 7 are formed by the ion implantation using a resist film 107. That is, arsenic ions are implanted into the substrate at an accelerating voltage of 50 kV and a dose rate of $5 \times 10^{11}$ cm$^{-2}$ to form the N-type layer 7R, and boron ions are implanted into the substrate at an accelerating voltage of 40 kV and a dose rate of $5 \times 10^{11}$ cm$^{-2}$ to form the P-type layer 7. Next, as shown in FIG. 13f, gate electrodes 3 are formed, and then shallow N+-regions 4a and 5a for forming source and drain regions 4 and 5, and shallow P+-regions 4Ra and 5Ra for forming source and drain regions 4R and 5R are successively formed by the ion implantation using a resist film 108. That is, phosphorus ions are implanted into the substrate at an accelerating voltage of 50 kV and a dose rate of $5 \times 10^{12}$ cm$^{-2}$ to form the N+-regions 4a and 5a and boron ions are implanted into the substrate at an accelerating voltage of 40 kV and a dose rate of $5 \times 10^{12}$ cm$^{-2}$ to form the P+-regions 4Ra and 5Ra. Then, as shown in FIG. 13g, side walls are formed at both ends of each gate electrode 3, and then a pair of source and drain regions 4 and 5 and another pair of source and drain regions 4R and 5R are formed by the ion implantation using a resist film 109. In more detail, deep N+-regions serving as the source and drain regions 4 and 5 are formed by implanting arsenic ions into the substrate at an accelerating voltage of 80 kV and a dose rate of $5 \times 10^{15}$ cm$^{-2}$, and deep P+-regions serving as the source and drain regions 4R and 5R are formed by implanting boron ions into the substrate at an accelerating voltage of 80 kV and a dose rate of $5 \times 10^{15}$ cm$^{-2}$.

Figure 13H:
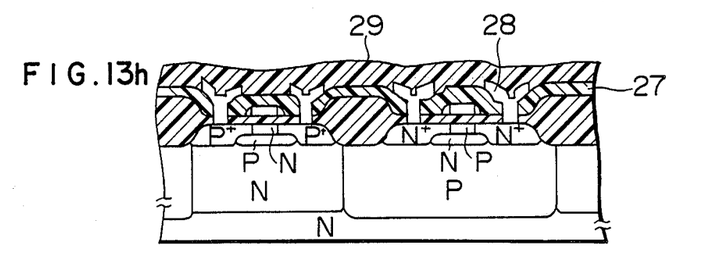

Finally, as shown in FIG. 13h, an inter-layer insulating film 27, interconnection 28 and a passivation film 29 are formed.

By using the above process, a P-channel MOSFET according to the present invention and an N-channel MOSFET according to the present invention can be formed on the same semiconductor substrate.

Further, according to the above process, a system can be formed which is low in power consumption, short in delay time, and highly reliable. For example, the above process is applicable to many fields such as the formation of a memory, gate array, microcomputer, or peripheral IC for microcomputer.

Next, explanation will be made of other embodiments of an MOSFET according to the present invention.

Figure 14:
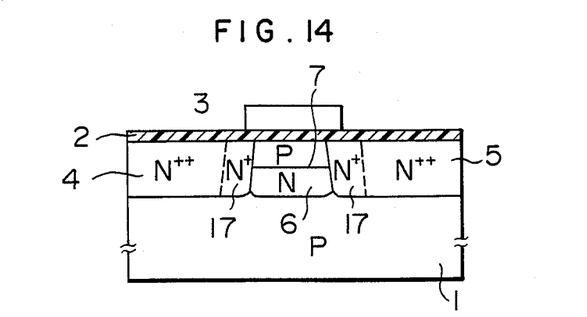
FIGS. 14 to 18 are sectional views showing other embodiments of an MOSFET according to the present invention.

In an embodiment shown in FIG. 14, the P-type layer 7 and the N-type layer 6 have the same length, but the impurity concentration of end portions 17 of the source and drain regions 4 and 5 on the channel side is made smaller than a maximum impurity concentration in the source and drain regions 4 and 5 by one order of magnitude, that is, is made equal to a value which is intermediate between the impurity concentration of the N-type layer 6 and that of the source and drain regions 4 and 5, to prevent the short channel effect from occurring. That is, the short channel effect is averted for the reason that those lower parts of the portions 17 which are contiguous to the N-type layer 6 act as the N-type layer 6.

Figure 15:
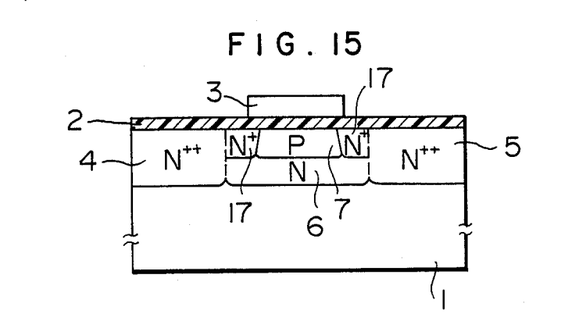

In an embodiment shown in FIG. 15, N+-layers 17 for compensating the difference in length between the P-type layer 7 and the N-type layer 6 has substantially the same impurity concentration as in the portions 17 of FIG. 14. The present embodiment is superior in lessening the short channel effect to the embodiments of FIGS. 7 and 14.

Figure 16:
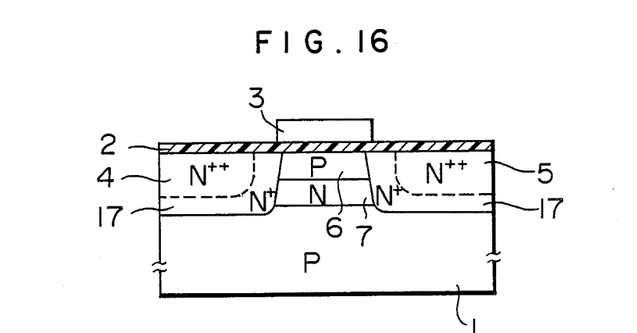

In an embodiment shown in FIG. 16, N+-layers 17 contiguous to a channel formation region are provided by forming the source and drain regions 4 and 5 through double diffusion techniques.

It is a matter of course that P-channel MOSFET's which are opposite in conductivity type of semiconductor region or layer to the embodiments of FIGS. 14 to 16, can be formed in accordance with the present invention.

Figure 17:
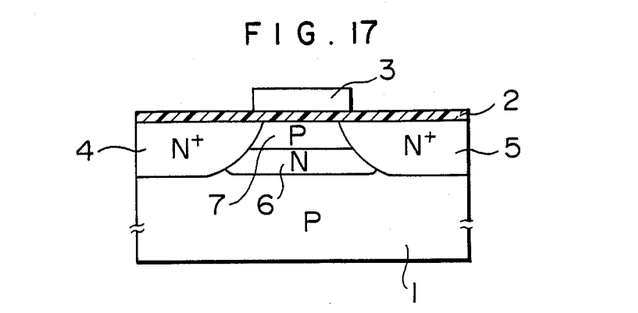

In an embodiment shown in FIG. 17, impurity diffusion in lateral directions from the source and drain regions having steeply graded impurity concentration distribution in the depthwise direction is utilized to form the source and drain regions in such a shape that the spacing between the source region and the drain region increases with the distance from the upper main surface of the substrate in a downward direction, and thus the length of the N-type layer 6 is greater than the length of the P-type layer 7, as in the embodiment of FIG. 7.

Figure 18:
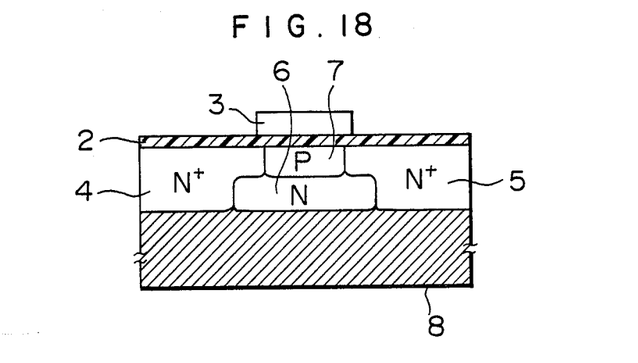

The present invention is also applicable to a case where an MOSFET is formed in a semiconductor layer on an insulating substrate. FIG. 18 shows a case where an N-channel MOSFET is formed on an insulating substrate, that is, shows an additional embodiment of an MOSFET according to the present invention. The present embodiment is turned off when a depletion layer due to the PN junction between the P-type layer 7 and the N-type layer 6 is extended through the N-type layer 6 and reaches an insulating (dielectric) substrate 8. Thus, the present embodiment can operate in the same manner as in the embodiment of FIG. 7. The insulating substrate 8 may be replaced by a semiconductive or conductive substrate coated with an insulating film.

Further, it is needless to say that the embodiments of FIGS. 12 and 14 to 17 and P-channel MOSFET's which are modified versions of the embodiments of FIGS. 14 to 17, can be formed on an insulating substrate or film, as in FIG. 18.

In the foregoing, various embodiments and modified versions thereof have been explained. However, it is a matter of course that a combination of two or more of these embodiments and modified versions can be used.

As has been explained in the foregoing, according to the present invention, an MOSFET can be formed which is higher in operation speed and less in deterioration of characteristics due to hot carrier than a conventional MOSFET, and moreover has a gate length less than 1 $\mu$m.

We claim:

1. A semiconductor switching device comprising:
   source and drain regions each having a first conductivity type formed on a semiconductor substrate opposite in conductivity type to said source and drain regions;
   a gate insulating film formed on a semiconductor surface between said source region and said drain region;
   a gate electrode formed on said gate insulating film; and
   a semiconductor layer lying beneath said gate insulating film and sandwiched between said source region and said drain region, said semiconductor layer being made up of a first layer and a second layer, said first layer being contiguous to said gate insulating film and opposite in conductivity type to said source and drain regions, said second layer lying beneath said first layer and having the same conductivity type as said source and drain regions, the length of said second layer between said source region and said drain region being greater than the length of said first layer between said source region and said drain region, wherein said first layer has an electric potential substantially equal to an electric potential of said substrate.

2. A semiconductor switching device according to claim 1, wherein a depletion layer due to a PN junction between said first layer and said second layer and another depletion layer due to a PN junction between said second layer and said semiconductor substrate, overlap each other.

3. A semiconductor switching device comprising:
   source and drain regions formed in a semiconductor material;
   a gate insulating film formed on a semiconductor surface between said source region and said rain region;
   a gate electrode formed on said gate insulating film; and
   a semiconductor layer lying beneath said gate insulating film and sandwiched between said source region and said drain region, said semicodnuctor layer being made up of a first layer and a second layer, said first layer being contiguous to said gate insulating film and opposite in conductivity type to said source and drain regions, said second layer lying beneath said first layer and having the same conductivity type as said source and drain regions, the length of said second layer between said source region and said drain region being greater than the length of said first layer between said source region and said drain region,
   wherein said source region, said drain region and said semiconductor layer are provided on an insulating material,
   wherein a depletion layer due to a PN junction between said first layer and said second layer is extended to said insulating material, and
   wherein said first layer has an electrical potential substantially equal to an electrical potential of said source region.

4. A semiconductor switching device according to claim 1, wherein a third layer having the same conductivity type as said source and drain regions and having an impurity concentration which is intermediate between the impurity concentration of said source and drain regions and the impurity concentration of said second layer, is provided between said semiconductor layer and each of said source and drain regions, and wherein said third layer acts as a portion of said second layer.

5. A semiconductor switching device according to claim 1, wherein a third layer having the same conductivity type as said source and drain regions and having an impurity concentration which is intermediate between the impurity concentration of said source and drain regions and the impurity concentration of said second layer, is provided between said first layer and each of said source and drain regions.

6. A semiconductor switching device according to claim 1, wherein the length of said second layer between the source and drain regions is set to a predetermined length relative to the length of the first layer between the source and drain regions and to predetermined length of said gate electrode to prevent a short channel effect for the predetermined length of said gate electrode.

7. A semiconductor switching device comprising:
source and drain regions each having a firs conductivity type formed on a semiconductor substrate opposite in conductivity type to said source and drain regions;
a gate insulating film formed on a semiconductor surface between said source region and said drain region;
a gate electrode formed on said gate insulating film; and
a semiconductor layer lying beneath said gate insulating film and sandwiched between said source region and said drain region, said semiconductor layer being made up of a first layer and a second layer, said first layer being contiguous to said gate insulating film and opposite in conductivity type to said source and drain regions, said second layer lying beneath said first layer and having the same conductivity type as said source and drain regions, the length of said second layer between said source region and said drain region being greater than the length of said first layer between said source region and said drain region, wherein first layer is not isolated from said substrate.

* * * * *